United States Patent
Casino et al.

(10) Patent No.: US 12,463,627 B2
(45) Date of Patent: Nov. 4, 2025

(54) LOW-POWER SYNCHRONIZATION USING TRANSITION DETECTION

(71) Applicant: QUALCOMM Incorporated, San Diego, CA (US)

(72) Inventors: Alexander Casino, San Diego, CA (US); Ying Duan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 45 days.

(21) Appl. No.: 18/608,728

(22) Filed: Mar. 18, 2024

(65) Prior Publication Data

US 2025/0293677 A1  Sep. 18, 2025

(51) Int. Cl.
*H03K 5/00* (2006.01)
*H03K 3/037* (2006.01)
*H03K 5/1534* (2006.01)

(52) U.S. Cl.
CPC ......... *H03K 5/1534* (2013.01); *H03K 3/0375* (2013.01)

(58) Field of Classification Search
CPC ............ H03K 5/13; H03K 5/131; H03K 5/14; H03K 2005/00013; H03K 2005/00078; H03K 2005/0019; H03K 2005/00058; H03K 3/0375; H03K 5/1534
See application file for complete search history.

(56) References Cited

U.S. PATENT DOCUMENTS

| | | | | |
|---|---|---|---|---|
| 5,671,258 | A * | 9/1997 | Burns | H04L 7/0337 375/360 |
| 7,692,980 | B2 * | 4/2010 | Seo | G11C 7/222 365/194 |
| 8,824,612 | B2 | 9/2014 | Ma | |
| 9,722,767 | B2 | 8/2017 | Simpson | |
| 10,382,027 | B2 | 8/2019 | Das et al. | |
| 2010/0277158 | A1 * | 11/2010 | Lee | G04F 10/005 324/76.79 |
| 2013/0003905 | A1 | 1/2013 | Jain et al. | |
| 2018/0241540 | A1 * | 8/2018 | Shibasaki | H03L 7/0807 |
| 2021/0133992 | A1 * | 5/2021 | Hristova | G06F 1/10 |

OTHER PUBLICATIONS

International Search Report and Written Opinion—PCT/US2025/015087—ISA/EPO—Jun. 10, 2025.

* cited by examiner

*Primary Examiner* — Tuan T Lam
(74) *Attorney, Agent, or Firm* — Loza & Loza, LLP

(57) ABSTRACT

A method of synchronization using samplers includes receiving a digital control code, converting the digital control code into control signals, inputting each of the control signals to a respective one of the samplers, detecting at least one bit transition in the digital control code, generating a synchronization pulse in response to detecting the at least one bit transition in the digital control code, and inputting the synchronization pulse to clock inputs of the samplers.

25 Claims, 12 Drawing Sheets

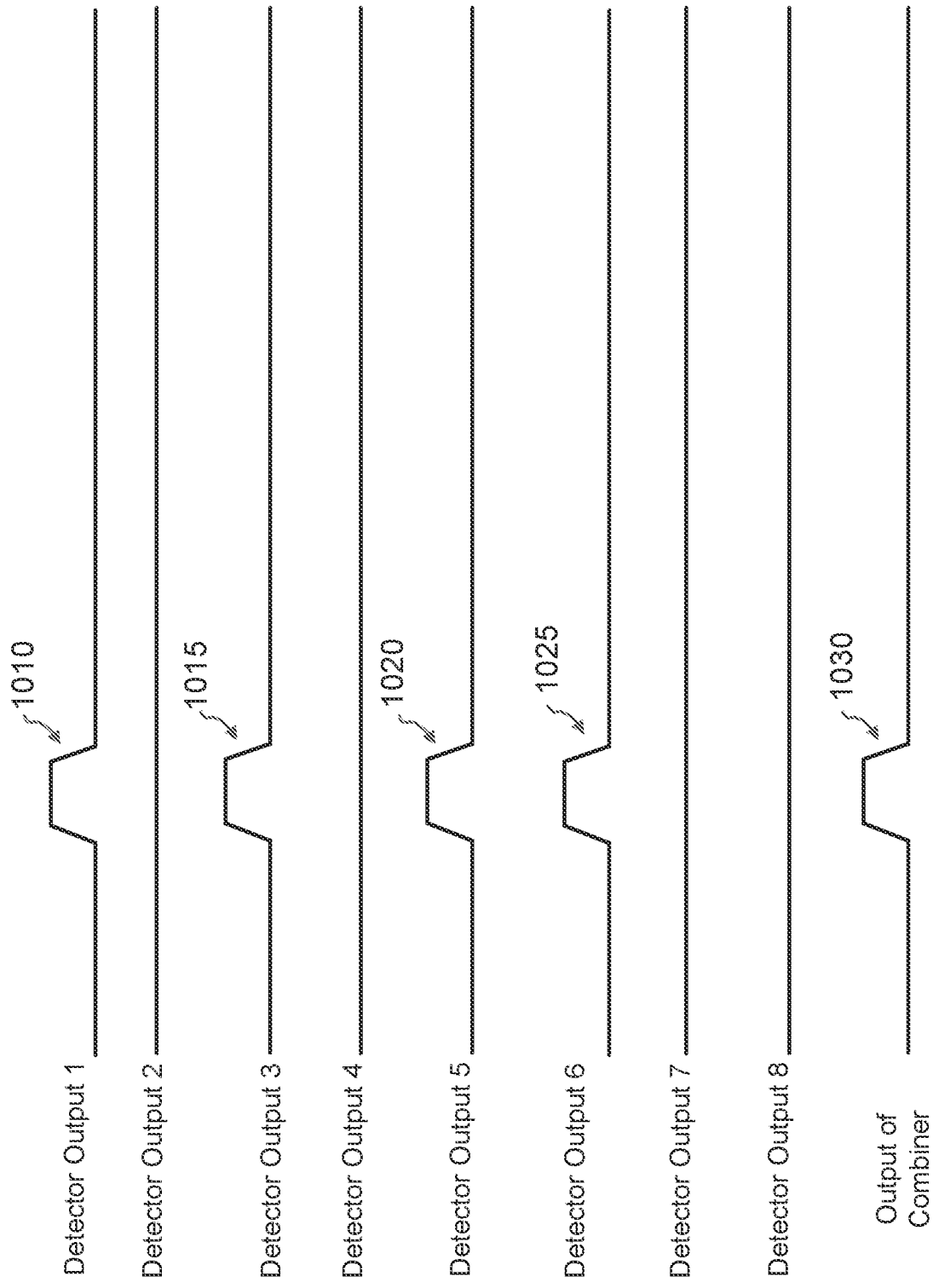

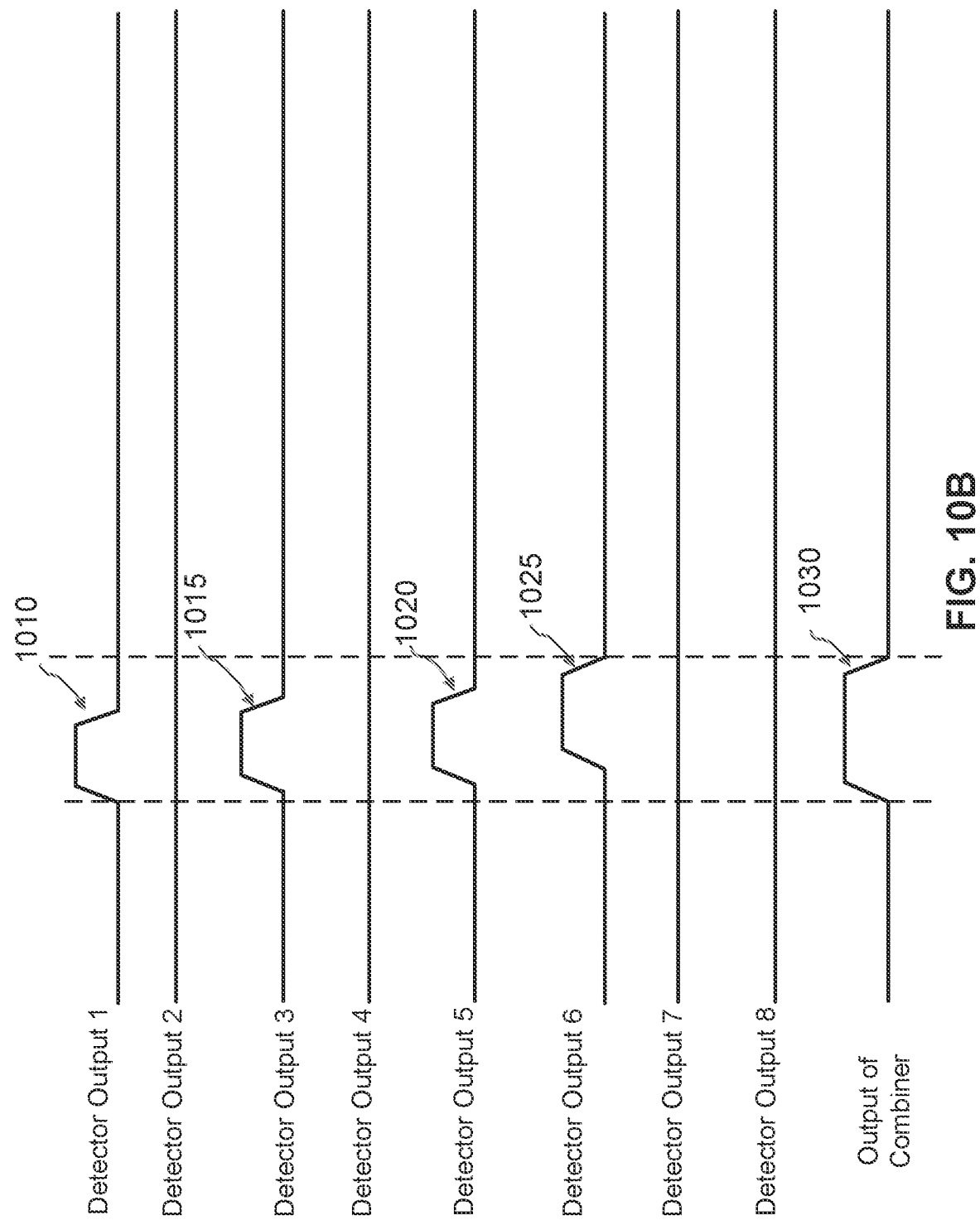

LOW-POWER SYNCHRONIZATION USING TRANSITION DETECTION

BACKGROUND

Field

Aspects of the present disclosure relate generally to synchronization, and, more particularly, to synchronization using signal transition detection.

Background

A programmable delay circuit may be used to delay a signal by a digitally programmable delay. For example, the delay circuit may delay a data signal to adjust the timing of the data signal relative to a clock signal or another data signal. The delay of the delay circuit may be programmed by delay control signals that are input to the delay circuit in parallel.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a decoder having inputs and outputs, wherein the decoder is configured to receive a digital control code at the inputs of the decoder, generate control signals based on the digital control code, and output each of the control signals at a respective one of the outputs of the decoder. The system also includes samplers, wherein each of the samplers has a respective signal input coupled to a respective one of the outputs of the decoder, a respective clock input, and a respective output. The system also includes a transition detection circuit configured to detect at least one bit transition in the digital control code, and a pulse generation circuit coupled to the transition detection circuit and the respective clock inputs of the samplers, wherein the pulse generation circuit is configured to output a synchronization pulse to the respective clock inputs of the samplers when the transition detection circuit detects the at least one bit transition in the digital control code.

A second aspect relates to a method of synchronization using samplers. The method includes receiving a digital control code, converting the digital control code into control signals, inputting each of the control signals to a respective one of the samplers, detecting at least one bit transition in the digital control code, generating a synchronization pulse in response to detecting the at least one bit transition in the digital control code, and inputting the synchronization pulse to clock inputs of the samplers.

A third aspect relates to a system. The system includes a decoder configured to receive a digital control code and convert the digital control code into control signals, a transition detection circuit configured to detect at least one bit transition in the digital control code, a pulse generation circuit configured to output a synchronization pulse when the transition detection circuit detects the at least one bit transition in the digital control code, and samplers, wherein each of the samplers is configured to receive a respective one of the control signals, capture a bit value of the respective one of the control signals based on the synchronization pulse, and output the captured bit value of the respective one of the control signals.

BRIEF DESCRIPTION OF THE DRAWINGS

FIG. 10A is a timing diagram showing an example in which multiple detection pulses are combined to generate a synchronization pulse according to certain aspects of the present disclosure.

FIG. 10B is a timing diagram showing an example of skew between detection pulses according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, wellknown structures and components are shown in block diagram form in order to avoid obscuring such concepts.

Figure 1:
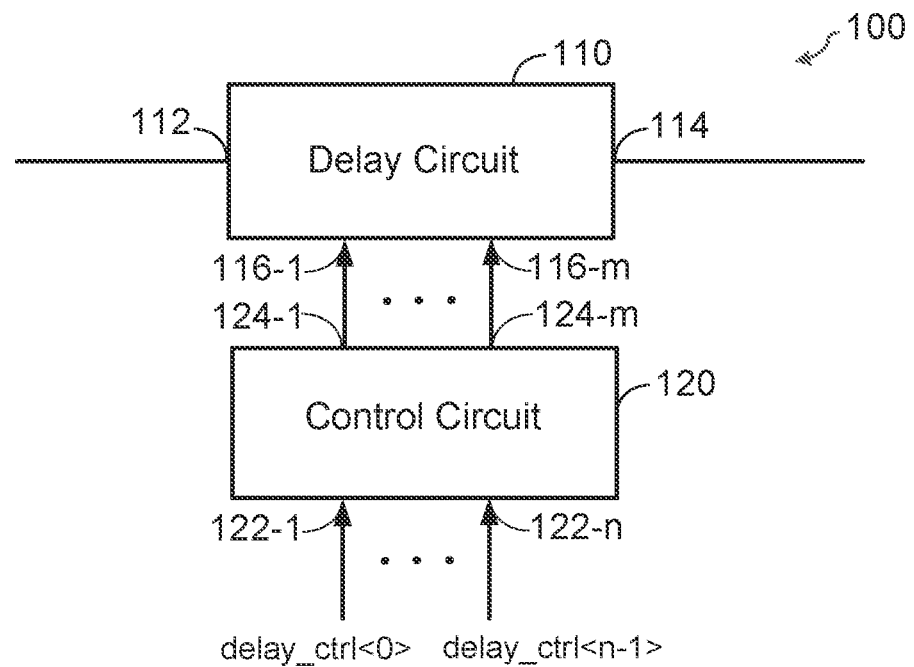
FIG. 1 shows an example of a delay circuit and a control circuit according to certain aspects of the present disclosure.

FIG. 1 shows an example of a system 100 including a digitally programmable delay circuit 110 according to certain aspects of the present disclosure. The delay circuit 110 is configured to receive a signal at an input 112, delay the signal by a programmable (i.e., tunable) delay, and output the delayed signal at an output 114. The delay circuit 110 may also be referred to as a delay line or another term. The signal may be a data signal, a clock signal, or another type of signal. For example, the delay circuit 110 may be used to adjust the timing of a data signal relative to a clock signal (e.g., to adjust clock-data skew) or another data signal.

In this example, the delay circuit 110 has control inputs 116-1 to 116-m configured to receive m delay control signals in parallel, where m is an integer greater than one and each of the inputs 116-1 to 116-m receives a respective one of the m delay control signals. The delay circuit 110 is configured to set the delay of the delay circuit 110 based on the delay control signals. For example, each of the delay control signals may include a respective one of m control bits, in which the delay circuit 110 is configured to set the delay of the delay circuit 110 based on the bit values of the m control bits.

FIG. 1 also shows an example of a control circuit 120 coupled to the delay circuit 110. The control circuit 120 has inputs 122-1 to 122-n configured to receive n digital signals in parallel, where n is an integer greater than one and each of the inputs 122-1 to 122-n receives a respective one of the n digital signals. In certain aspects, each of the digital signals includes a respective one of n bits of a digital control code delay_ctrl <n–1:0> specifying a delay for the delay circuit 110. In this example, the control circuit 120 also has outputs 124-1 to 124-m where each of the outputs 124-1 to 124-m is coupled to a respective one of the control inputs 116-1 to 116-m of the delay circuit 110. The relationship between the number of bits (i.e., n) in the digital control code delay_ctrl <n–1:0> and the number of control bits (i.e., m) is discussed further below.

The control circuit 120 is configured to convert the digital control code delay_ctrl <n–1:0> into the m control bits, and output the m control bits to the delay circuit 110 in parallel via the outputs 124-1 to 124-m. In one example, the digital control code delay_ctrl <n–1:0> includes a binary digital code specifying the delay of the delay circuit 110. In this example, the control circuit 120 may be configured to convert the binary digital code into a thermometer code (sometimes referred to as a unary code) in which the bits in the thermometer code provide the m control bits, as discussed further below.

Figure 2:
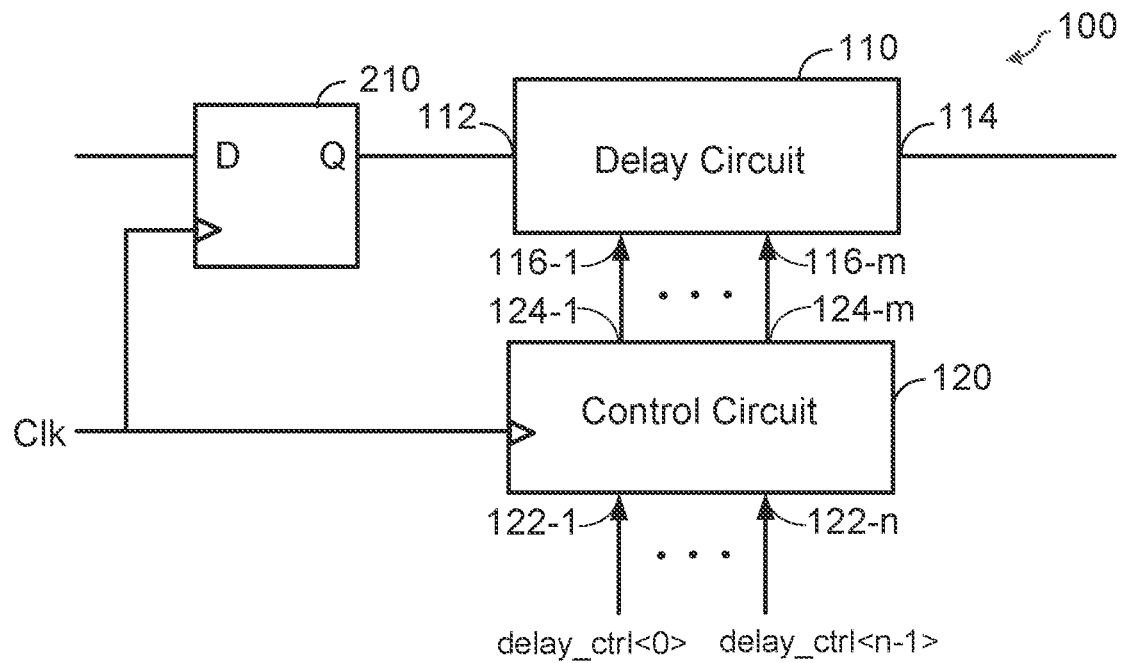
FIG. 2 shows an example in which the control circuit is clocked by a clock signal according to certain aspects of the present disclosure.

FIG. 2 shows an example of a flip-flop 210 coupled to the input 112 of the delay circuit 110. The flip-flop 210 has a signal input D configured to receive the signal (e.g., data signal) being delayed by the delay circuit 110, a clock input configured to receive a clock signal Clk, and an output Q coupled to the input 112 of the delay circuit 110. In this example, the flip-flop 210 may be used to synchronize the signal (e.g., data signal) with the clock signal Clk before the signal is input to the delay circuit 110. The delay circuit 110 may then delay the signal to adjust the timing of the signal with respect to the clock signal. However, it is be appreciated that the present disclosure is not limited to this example, and that the flip-flop 210 may be omitted in some implementations (e.g., implementations where the delay circuit 110 is used to delay the signal with respect to another signal or timing reference).

In the example in FIG. 2, the clock signal Clk is also input to the control circuit 120 to time operations in the control circuit 120. In this example, the control circuit 120 uses the clock signal Clk to synchronize the m control bits with the clock signal Clk before the m control bits are output to the delay circuit 110 via the outputs 124-1 to 124-m. The synchronization of the m control bits helps prevent glitches in the delay circuit 110 when the m control bits are updated (e.g., one or more bit values in the m control bits change). A glitch in the delay circuit 110 may cause the delay circuit 110 to output a narrow pulse, which may cause a malfunction (e.g., a timing violation) in a circuit (e.g., a flip-flop) located downstream of the delay circuit 110.

Figure 3:
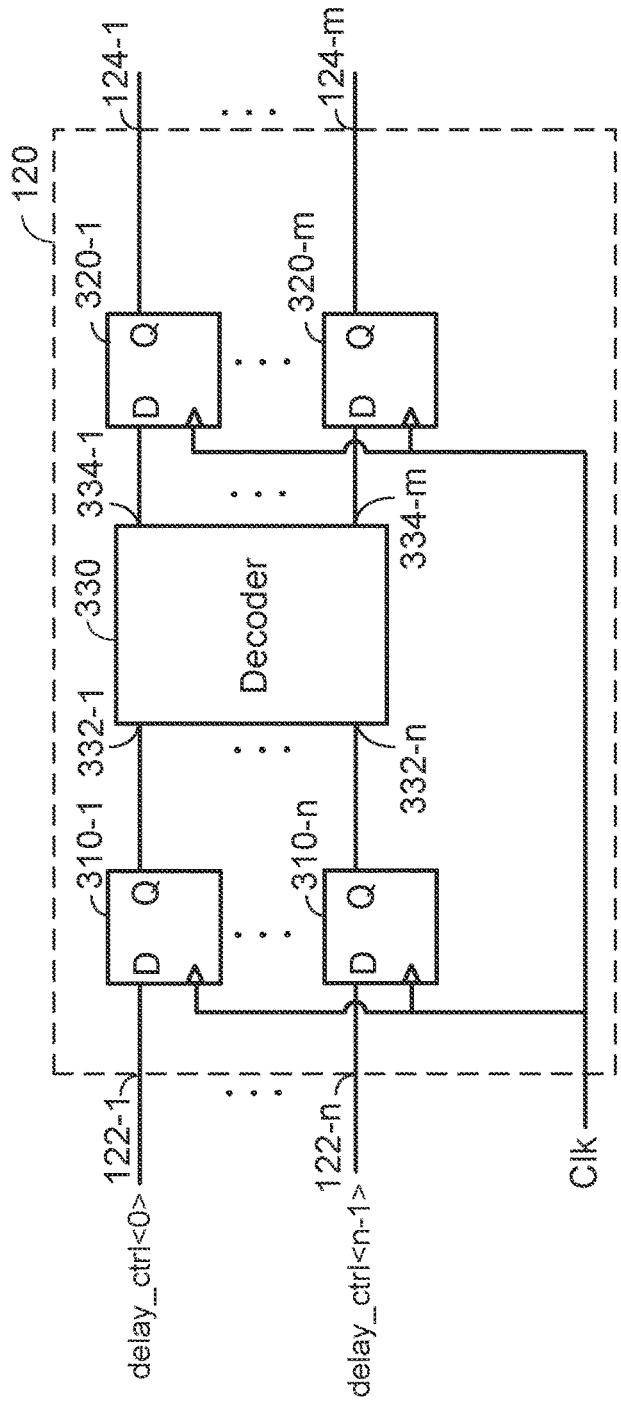
FIG. 3 shows an exemplary implementation of the control circuit including flip-flops clocked by the clock signal according to certain aspects of the present disclosure.

FIG. 3 shows an exemplary implementation of the control circuit 120 according to certain aspects. In this example, the control circuit 120 includes flip-flops 310-1 to 310-n, flip-flops 320-1 to 320-m, and a decoder 330. The decoder 330 is configured to receive the n bits of the digital control code delay_ctrl <n–1:0> via inputs 332-1 to 332-n, convert the n bits of digital control code delay_ctrl <n–1:0> into the m control bits, and output the m control bits in parallel via outputs 334-1 to 334-m.

In certain aspects, the decoder 330 may be implemented with one or more binary-to-thermometer decoders. Binary-to-thermometer decoders for converting a binary code into a thermometer code are known in the art and are commonly implemented with combinational logic. For example, a binary-to-thermometer decoder may receive a binary code representing a number N in binary form and convert the binary code into a thermometer code representing the number N by ones repeated N times. For example, the number 4 may be represented in a 3-bit binary code as 100 and represented in an 8-bit thermometer code as 00001111. However, it is to be appreciated that the decoder 330 is not limited to this example.

In this example, each of the flip-flops 310-1 to 310-n has a respective signal input D (also referred to as a data input), a respective clock input, and a respective output Q. The respective signal input D of each of the flip-flops 310-1 to 310-n is coupled to a respective one of the inputs 122-1 to 122-n to receive a respective one of the n bits of the digital control code delay_ctrl <n–1:0>. The respective clock input of each of the flip-flops 310-1 to 310-n is configured to receive the clock signal Clk. The respective output Q of each of the flip-flops 310-1 to 310-n is coupled to a respective one of the inputs 332-1 to 332-n of the decoder 330. In this example, the flip-flops 310-1 to 310-n synchronize the bits of the digital control code delay_ctrl <n–1:0> with the clock signal Clk and output the synchronized bits of the digital control code to the decoder 330. For example, the bits of the digital control code delay_ctrl <n–1:0> may be skewed (due to mismatches in the signal paths of the bits from the circuit that generates the digital control code delay_ctrl <n–1:0> to the control circuit 120). In this example, the flip-flops 310-1 to 310-n may be used to reduce the skew between the bits (i.e., deskew the bits) by synchronizing the bits with the clock signal Clk. The flip-flops 310-1 to 310-n may be implemented with rising-edge triggered flip-flops (also referred to as positive-edge triggered flip-flops) or falling-edge triggered flip-flops (also referred to as negative-edge triggered flip-flops).

In this example, each of the flip-flops 320-1 to 320-m has a respective signal input D, a respective clock input, and a respective output Q. The respective signal input D of each of the flip-flops 320-1 to 320-m is coupled to a respective one of the outputs 334-1 to 334-m of the decoder 330 to receive a respective one of the delay control signals. The respective clock input of each of the flip-flops 320-1 to 320-*m* is configured to receive the clock signal Clk. The respective output Q of each of the flip-flops 320-1 to 320-*m* is coupled to a respective one of the outputs 124-1 to 124-*m* of the control circuit 120. In this example, the flip-flops 320-1 to 320-*m* synchronize the m control bits of the delay control signals with the clock signal Clk and output the synchronized m control bits to the delay circuit 110 (shown in FIG. 2) via the respective outputs 124-1 to 124-*m* of the control circuit 120. The flip-flops 320-1 to 320-*m* may be implemented with rising-edge triggered flip-flops or falling-edge triggered flip-flops.

Thus, in this example, the flip-flops 320-1 to 320-*m* synchronize the m control bits of the delay control signals using the clock signal Clk before the m control bits are input to the delay circuit 110 (shown in FIG. 2). The synchronization of the m control bits helps prevent glitching in the delay circuit 110.

However, using the clock signal Clk to synchronize the m control bits of the delay control signals uses a large amount of power, and may not be suitable for high-frequency low-power applications. This is because the flip-flops 310-1 to 310-*n* and 320-1 to 320-*m* switch at the frequency of the clock signal clk (which consumes power) even in cases where the digital control code delay_ctrl <n−1:0> (and hence the m control bits) does not change frequently. For example, the delay circuit 110 may be programmed during a calibration procedure at start-up, and then periodically updated (e.g., to account for temperature changes) at a rate much slower than the frequency of the clock signal Clk.

Figure 4:
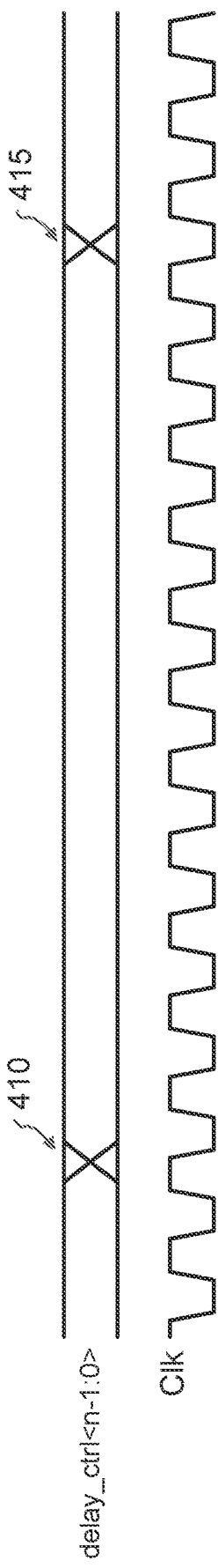
FIG. 4 is a timing diagram showing an example of signals in the control circuit of FIG. 3 according to certain aspects of the present disclosure.

An example of this is illustrated in the timing diagram in FIG. 4, which shows an example of the digital control code delay_ctrl <n−1:0> and the clock signal Clk. FIG. 4 shows an example of a first update 410 and a second update 420 of the digital control code delay_ctrl <n−1:0> in which each update may include one or more bit value changes in the digital control code delay_ctrl <n−1:0>. In this example, the clock signal Clk includes a large number of pulses between the updates 410 and 415, which causes switching activity in the flip-flops 310-1 to 310-*n* and 320-1 to 320-*m* between the updates 410 and 415. The switching activity consumes power even through there is no change in the digital control code delay_ctrl <n−1:0> between the updates 410 and 415.

To address the above, aspects of the present disclosure detect a change in the digital control code delay_ctrl <n−1:0> and generate a pulse for synchronizing the delay control signals when the change is detected. In cases where the digital control code delay_ctrl <n−1:0> does not change frequently, this significantly reduces power consumption compared with using the clock signal Clk for synchronization. The above features and other features of the present disclosure are discussed further below.

Figure 5:
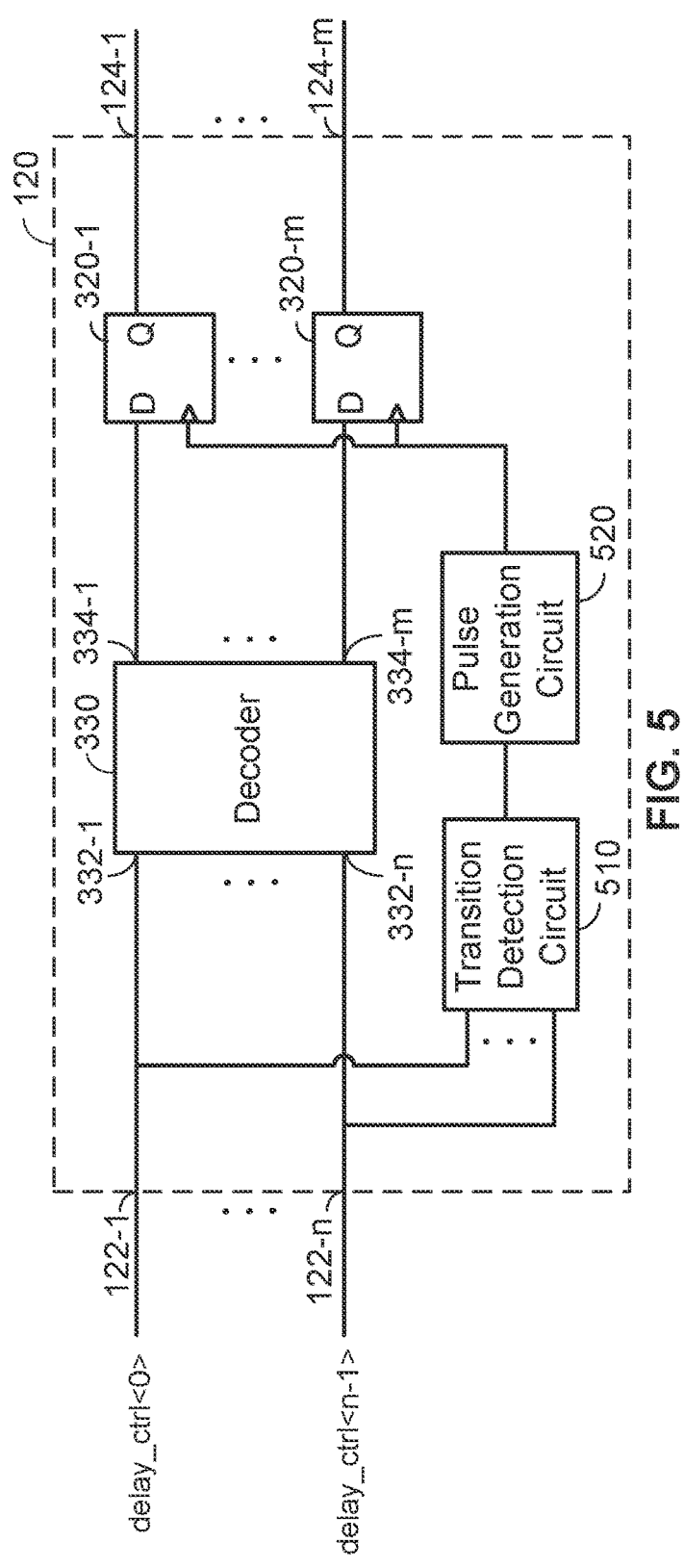
FIG. 5 shows an exemplary implementation of the control circuit including a transition detection circuit and a pulse generation circuit according to certain aspects of the present disclosure.

FIG. 5 shows an exemplary implementation of the control circuit 120 using transition detection for synchronization according to certain aspects. In this example, the control circuit 120 includes the decoder 330 and the flip-flops 320-1 to 320-*m* discussed above. The control circuit 120 also includes a transition detection circuit 510 and a pulse generation circuit 520 according to certain aspects. In this example, the control circuit 120 does not include the flip-flops 310-1 to 310-*n* shown in FIG. 3. This is because the transition detection circuit 510 and the pulse generation circuit 520 are able to tolerate skew between the bits of the digital control code delay_ctrl <n−1:0>, as discussed further below.

In the example in FIG. 5, each of the inputs 332-1 to 332-*n* of the decoder 330 is coupled to the respective one of the inputs 122-1 to 122-*n* of the control circuit 120 to receive the respective one of the n bits of the digital control code delay_ctrl<n−1:0>. Each of the outputs 334-1 to 334-*m* of the decoder 330 is coupled to the signal input D of the respective one of the flip-flops 320-1 to 320-*m* to output the respective one of the m control bits to the respective one of the flip-flops 320-1 to 320-*m*. The output Q of each of the flip-flops 320-1 to 320-*m* is coupled to the respective one of the outputs 124-1 to 124-*m* of the control circuit 120, as discussed above.

In this example, the transition detection circuit 510 is coupled to each of the inputs 122-1 to 122-*n* of the control circuit 120. The pulse generation circuit 520 is coupled to the transition detection circuit 510 and the clock inputs of the flip-flops 320-1 to 320-*m*, as shown in FIG. 5.

The transition detection circuit 510 is configured to detect a transition (i.e., change) in at least one of the n bits of the digital control code delay_ctrl<n−1:0> when the digital control code delay_ctrl<n−1:0> is updated. When the digital control code delay_ctrl<n−1:0> is updated, the decoder 330 receives the updated digital control code delay_ctrl<n−1:0> and outputs updated m control bits based on the updated the digital control code delay_ctrl<n−1:0>.

When the transition detection circuit 510 detects a transition in the at least one of the n bits of the digital control code delay_ctrl<n−1:0>, the pulse generation circuit 520 is configured to generate a synchronization pulse. The pulse generation circuit 520 outputs the synchronization pulse to the clock inputs of the flip-flops 320-1 to 320-*m*, which causes the flip-flops 320-1 to 320-*m* to synchronize the output of the updated m control bits to the delay circuit 110 (shown in FIG. 2) based on the synchronization pulse. In one example, each of the flip-flops 320-1 to 320-*m* may be implemented with a rising-edge triggered flip-flop configured to latch (i.e., capture) the respective control bit value at the respective signal input D on a rising edge of the synchronization pulse at the respective clock input and output the latched (i.e., captured) control bit value at the respective output Q until a rising edge of the next synchronization pulse at the respective clock input. In another example, each of the flip-flops 320-1 to 320-*m* may be implemented with a falling-edge triggered flip-flop configured to latch (i.e., capture) the respective control bit value at the respective signal input D on a falling edge of the synchronization pulse at the respective clock input and output the latched (i.e., captured) control bit value at the respective output Q until a falling edge of the next synchronization pulse at the respective clock input. However, it is to be appreciated that the present disclosure is not limited to this example.

Figure 6:
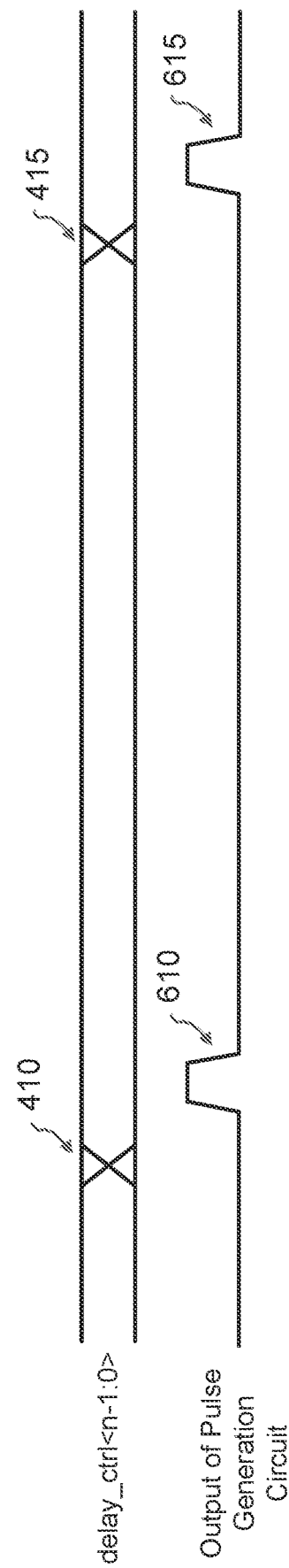
FIG. 6 is a timing diagram showing an example of signals in the control circuit of FIG. 5 according to certain aspects of the present disclosure.

The transition detection circuit 510 and the pulse generation circuit 520 significantly reduce power consumption in the flip-flops 320-1 to 320-*m* compared with using the clock signal Clk for synchronization. This is because the pulse generation circuit 520 generates a synchronization pulse when the digital control code delay_ctrl<n−1:0> is updated, which does not occur frequently. An example of this is illustrated in the timing diagram of FIG. 6, which shows an example of the digital control code delay_ctrl <n−1:0> and synchronization pulses 610 and 615. As shown in FIG. 6, the pulse generation circuit 620 outputs the synchronization pulses 610 and 615 in response to the first update 410 and the second update 415, respectively, of the digital control code delay_ctrl <n−1:0>. In contrast, the clock signal Clk shown in FIG. 4 inputs pulses to the clock inputs of the flip-flops 320-1 to 320-*m* at the frequency of the clock signal Clk regardless of whether the digital control code delay_ctrl <n−1:0> is updated.

Figure 7:
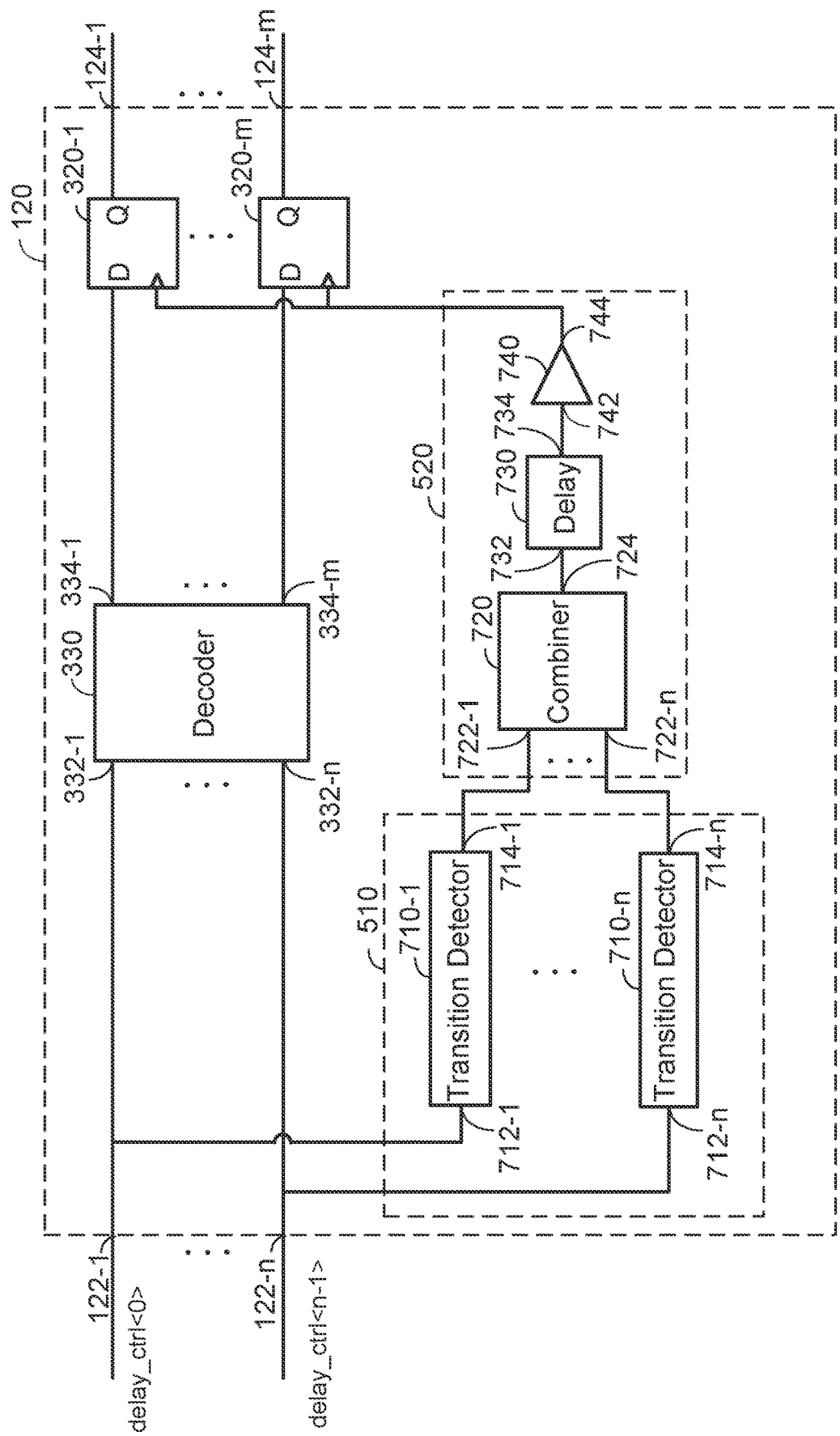
FIG. 7 shows an exemplary implementation of the transition detection circuit and the pulse generation circuit according to certain aspects of the present disclosure.

FIG. 7 shows an exemplary implementation of the transition detection circuit 510 and the pulse generation circuit 520. In this example, the transition detection circuit 510 includes transition detectors 710-1 to 710-*n*. Each of the transition detectors 710-1 to 710-*n* has a respective detector input 712-1 to 712-*n* coupled to a respective one of the inputs 122-1 to 122-*n* of the control circuit 120, and a respective detector output 714-1 to 714-*n*. Each of the transition detectors 710-1 to 710-*n* is configured to detect a bit transition at the respective detector input 712-1 to 712-*n* and output a detection pulse at the respective detector output 714-1 to 714-*n* when the bit transition is detected. Since each of the transition detectors 710-1 to 710-*n* is coupled to a respective one of the inputs 122-1 to 122-*n* of the control circuit 120, each of the transition detectors 710-1 to 710-*n* detects a bit transition of a respective one of the n bits of the digital control code delay_ctrl <n−1:0>. A bit transition may be a transition from low (logic zero) to high (logic one) or a transition from high (logic one) to low (logic zero).

In this example, when the digital control code delay_ctrl<n−1:0> is updated, the transition detectors 710-1 to 710-*n* output one or more detection pulses at the respective detector outputs 714-1 to 714-*n*. The number of detection pulses that are output by the transition detectors 710-1 to 710-*n* depends on the number of bits in the digital control code delay_ctrl<n−1:0> that are changed. For example, when one bit is changed, the transition detectors 710-1 to 710-*n* output one detection pulse. When two bits are changed, the transition detectors 710-1 to 710-*n* output two detection pulses. When three bits are changed, the transition detectors 710-1 to 710-*n* output three detection pulses, and so forth.

In the example in FIG. 7, the pulse generation circuit 520 includes a combiner 720, a pulse delay circuit 730, and a clock driver 740. The combiner 720 has inputs 722-1 to 722-*n* and an output 724. Each of the inputs 722-1 to 722-*n* of the combiner 720 is coupled to the detector output 714-1 to 714-*n* of a respective one of the transition detectors 710-1 to 710-*n*. The pulse delay circuit 730 has an input 732 coupled to the output of the combiner 720, and an output 734. The clock driver 740 has an input 742 coupled to the output 734 of the pulse delay circuit 730, and an output 744 coupled to the clock inputs of the flip-flops 320-1 to 320-*m*.

In the example, the combiner 720 is configured to receive the one or more detection pulses from the transition detectors 710-1 to 710-*n*, combine the one or more detection pulses to generate a synchronization pulse, and output the synchronization pulse at the output 724. In cases where the transition detectors 710-1 to 710-*n* output one detection pulse (i.e., only one bit of the digital control code delay_ctrl<n−1:0> is changed), the combiner 720 passes the detection pulse to the output 734 as the synchronization pulse.

The pulse delay circuit 730 receives the synchronization pulse from the combiner 720 and delays the synchronization pulse by the delay of the pulse delay circuit 730. In this example, the delay of the pulse delay circuit 730 sets the delay between the time that the transition detection circuit 510 detects at least one bit transition in the digital control code delay_ctrl<n−1:0> and the time that the synchronization pulse is input to the clock inputs of the flip-flops 320-1 to 320-*m*. In certain aspects, the delay of the pulse delay circuit 730 may be set so that the arrival of the synchronization pulse at the clock inputs of the flip-flops 320-1 to 320-*m* meets the setup time requirement of the flip-flops 320-1 to 320-*m*. As used herein, the "setup time" may refer to a minimum amount of time that an update to the m control bits needs to be stable at the signal inputs D of the flip-flops 320-1 to 320-*m* before the synchronization pulse arrives at the clock inputs of the flip-flops 320-1 to 320-*m* to synchronize the m control bits.

The clock driver 740 is configured to receive the synchronization pulse from the pulse delay circuit 730 and drive the clock inputs of the flip-flops 320-1 to 320-*m* with the synchronization pulse. The clock driver 740 may also be referred to as a clock buffer or another term. The clock driver 740 may be omitted in implementations where the pulse delay circuit 730 has sufficient drive strength to drive the clock inputs of the flip-flops 320-1 to 320-*m*.

Figure 8:
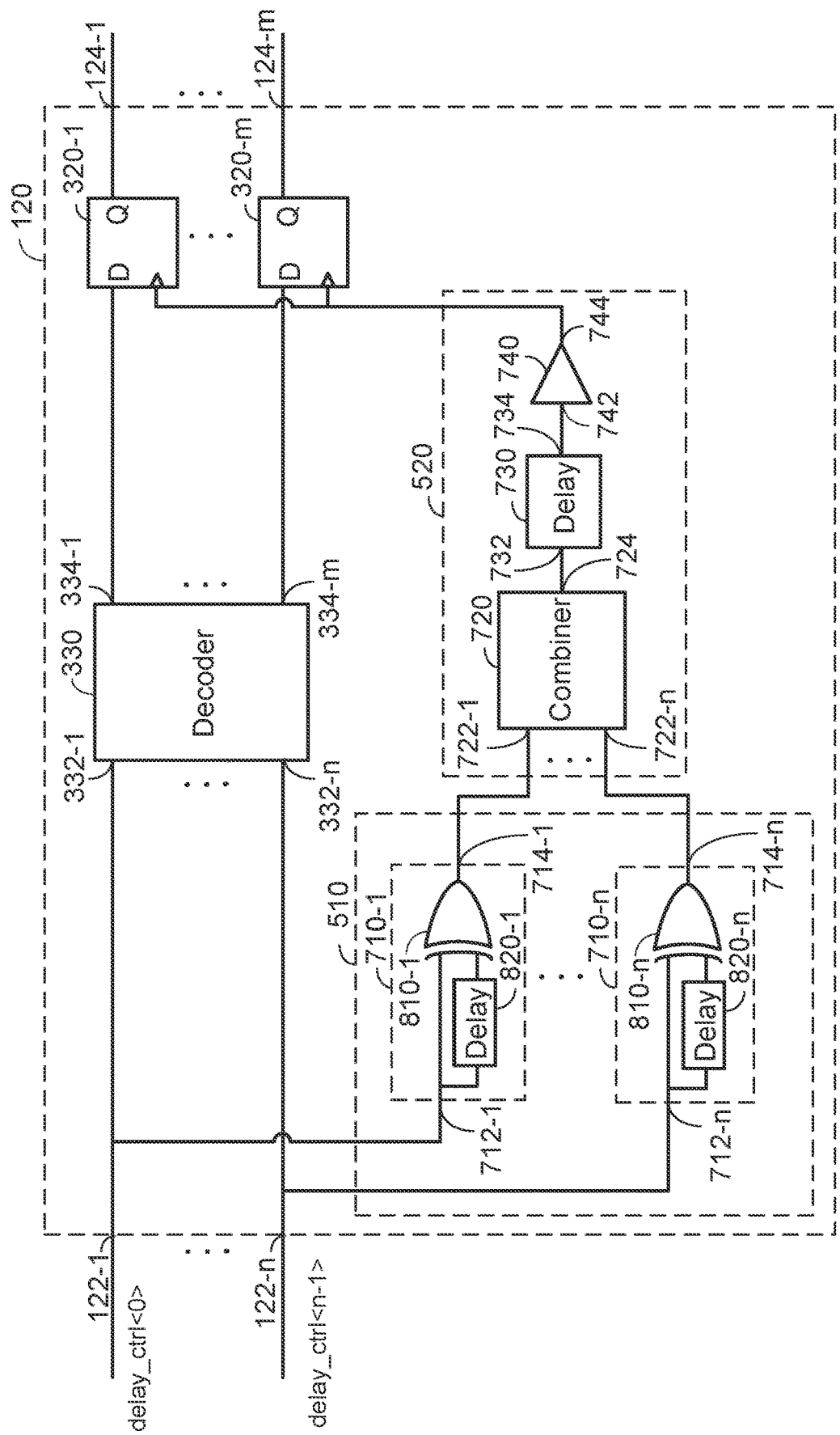
FIG. 8 shows an exemplary implementation of transition detectors according to certain aspects of the present disclosure.

FIG. 8 shows an exemplary implementation of the transition detectors 710-1 to 710-*n* according to certain aspects. In this example, each of the transition detectors 710-1 to 710-*n* includes a respective exclusive-OR gate 810-1 to 810-*n* and a respective delay circuit 820-1 to 820-*n*. In each of the transition detectors 710-1 to 710-*n*, the respective exclusive-OR gate 810-1 to 810-*n* has a first input coupled to the respective detector input 712-1 to 712-*n*, a second input, and an output coupled to the respective detector output 714-1 to 714-*n*. Also, in each of the transition detectors 710-1 to 710-*n*, the respective delay circuit 820-1 to 820-*n* is coupled between the respective detector input 712-1 to 712-*n* and the second input of the respective exclusive-OR gate 810-1 to 810-*n*. It is to be appreciated that an exclusive-OR gate may be implemented with a combination of logic gates.

In this example, each of the transition detectors 710-1 to 710-*n* is configured to output a detection pulse when a bit transition occurs at the respective detector input 712-1 to 712-*n*, in which the pulse width of the detection pulse is approximately equal to the delay of the respective delay circuit 820-1 to 820-*n*. Thus, the pulse width of the detection pulse of each of the transition detectors 710-1 to 710-*n* may be set by setting the delay of the respective delay circuit 820-1 to 820-*n* accordingly. For example, the pulse width of the detection pulse of each of the transition detectors 710-1 to 710-*n* may be set to a pulse width meeting a hold time requirement of the flip-flops 320-1 to 320-*m*. As used herein, the "hold time" may refer to a minimum amount of time that an update to the m control bits needs to remain stable at the signal inputs D of the flip-flops 320-1 to 320-*m* after the synchronization pulse arrives at the clock inputs of the flip-flops 320-1 to 320-*m* to synchronize the m control bits.

Figure 9:
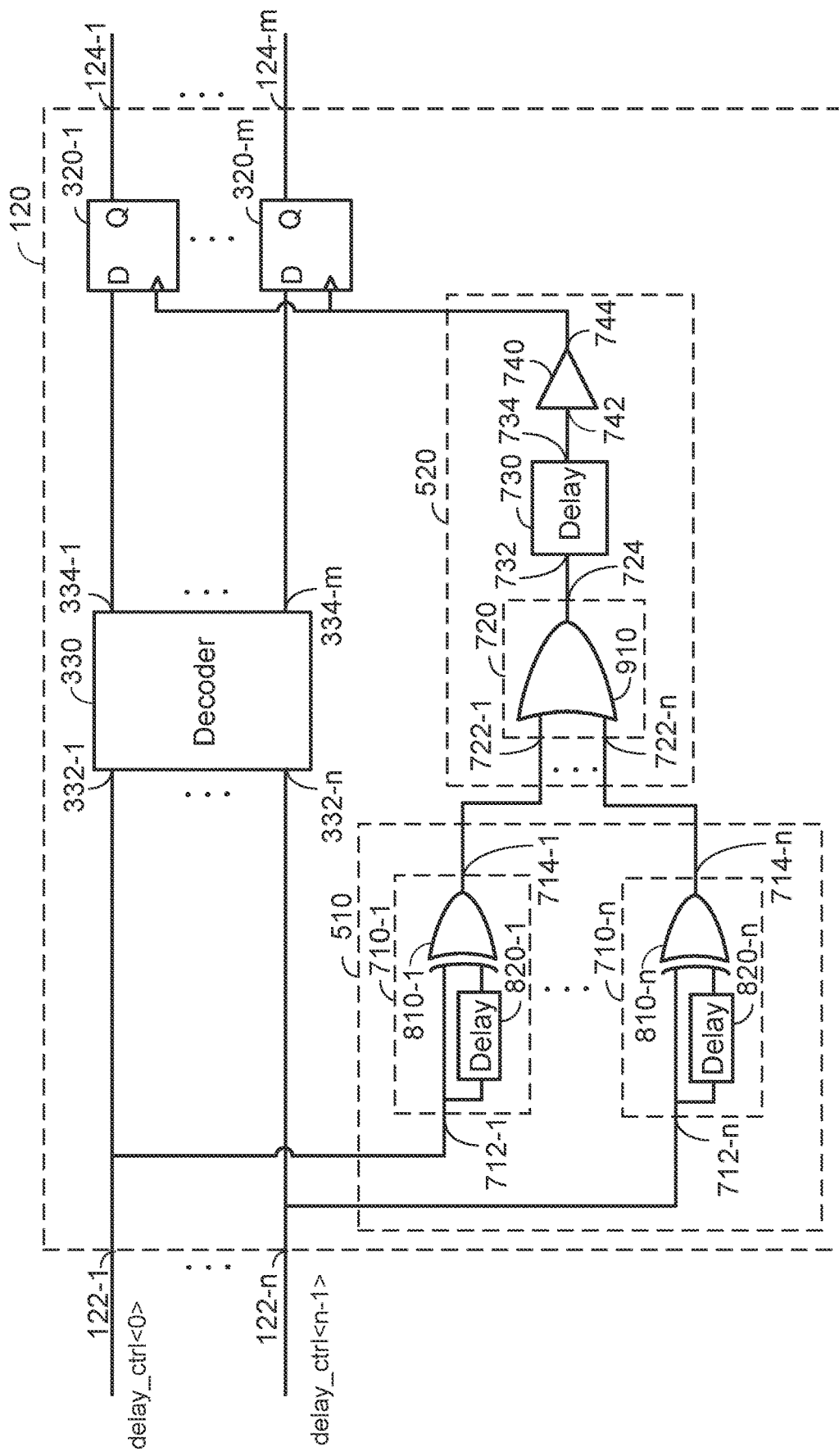
FIG. 9 shows an exemplary implementation of a combiner according to certain aspects of the present disclosure.

FIG. 9 shows an exemplary implementation of the combiner 720 according to certain aspects. In this example, the combiner 720 includes an OR gate 910 having multiple inputs and an output. Each of the inputs of the OR gate 910 is coupled to the detector output 714-1 to 740-*n* of a respective one the transition detectors 710-1 to 710-*n*, and the output of the OR gate 910 is coupled to the input 732 of the pulse delay circuit 730. In this example, the OR gate 910 combines one or more detection pulses from the transition detectors 710-1 to 710-*n* by performing an OR function on the one or more detection pulses. It is to be appreciated that the OR gate 910 may be implemented with a network of multiple individual OR gates and/or other types of logic gates. In general, the OR gate 910 may be implemented with any suitable circuit configured to perform an OR function.

FIG. 10A is a timing diagram showing an example of pulse combining in the combiner 720 according to certain aspects. In this example, the number of bits in the digital control code delay_ctrl<n−1:0> is eight (i.e., n=8). FIG. 10A shows an example of the output signals of the transition detectors 710-1 to 710-8 (labeled "Detector Output 1" to "Detector Output 8") and the output signal of the combiner 720.

In this example, the digital control code delay_ctrl<n−1:0> is updated in which four of the eight bits of the digital control code delay_ctrl<n−1:0> are changed. In this example, the changes in the four bits cause the transition detectors 710-1, 710-3, 710-5, and 710-6 to output detection pulses 1010, 1015, 1020, and 1025, respectively. The detection pulses 1010, 1015, 1020, and 1025 overlap and have approximately the same pulse width (assuming the delay circuits 820-1 to 820-8 in the transition detectors 710-1 to 710-8 have approximately the same delay). In this example, the combiner 720 performs an OR function on the output signals of the transition detectors 710-1 to 710-8, which combines (i.e., merges) the detection pulses 1010, 1015, 1020, and 1025 into a synchronization pulse 1030, which is output from the combiner 720.

It is to be appreciated that the present disclosure is not limited to the example shown in FIG. 10A. For example, other updates of the digital control code delay_ctrl<n−1:0> may include different numbers of bit changes. In general, the combiner 720 outputs a synchronization pulse when at least one bit of the digital control code delay_ctrl<n−1:0> is changed.

The combiner 720 does not require detection pulses to be exactly aligned or have exactly the same pulse width in order to combine the detection pulses to generate a synchronization pulse. The combiner 720 can tolerate some amount of skew (i.e., misalignment) between the detection pulses and/or some amount of mismatch in the widths of the detection pulses. An example of this is illustrated in FIG. 10B, which shows an example in which the detection pulses 1010, 1015, 1020, and 1025 are skewed (i.e., misaligned) due to, for example, skew between the corresponding bits of the digital control code delay_ctrl<n−1:0>. Also, in this example, the detection pulse 1025 has a wider width than the detection pulse 1010. This may be due to, for example, a mismatch between the delay of the delay circuit 820-1 for the pulse 1010 and the delay of the delay circuit 820-6 for the pulse 1025 for the exemplary implementation shown in FIGS. 8 and 9. In this example, even with the skew between the detection pulses 1010, 1015, 1020, and 1025, the combiner 720 is still able to generate the synchronization pulse 1030 using an OR function since the detection pulses 1010, 1015, 1020, and 1025 overlap.

As shown in the example in FIG. 10B, the combiner 720 is able to tolerate skew between the detection pulses 1010, 1015, 1020, and 1025 due to skew between the corresponding bits of the digital control code delay_ctrl<n−1:0>. Because the combiner 720 is able to tolerate skew between the bits of the digital control code delay_ctrl<n−1:0>, the flip-flops 310-1 to 310-n used for deskewing the bits of the digital control code delay_ctrl<n−1:0> shown in FIG. 3 may be omitted, which further reduces power consumption.

Figure 11:
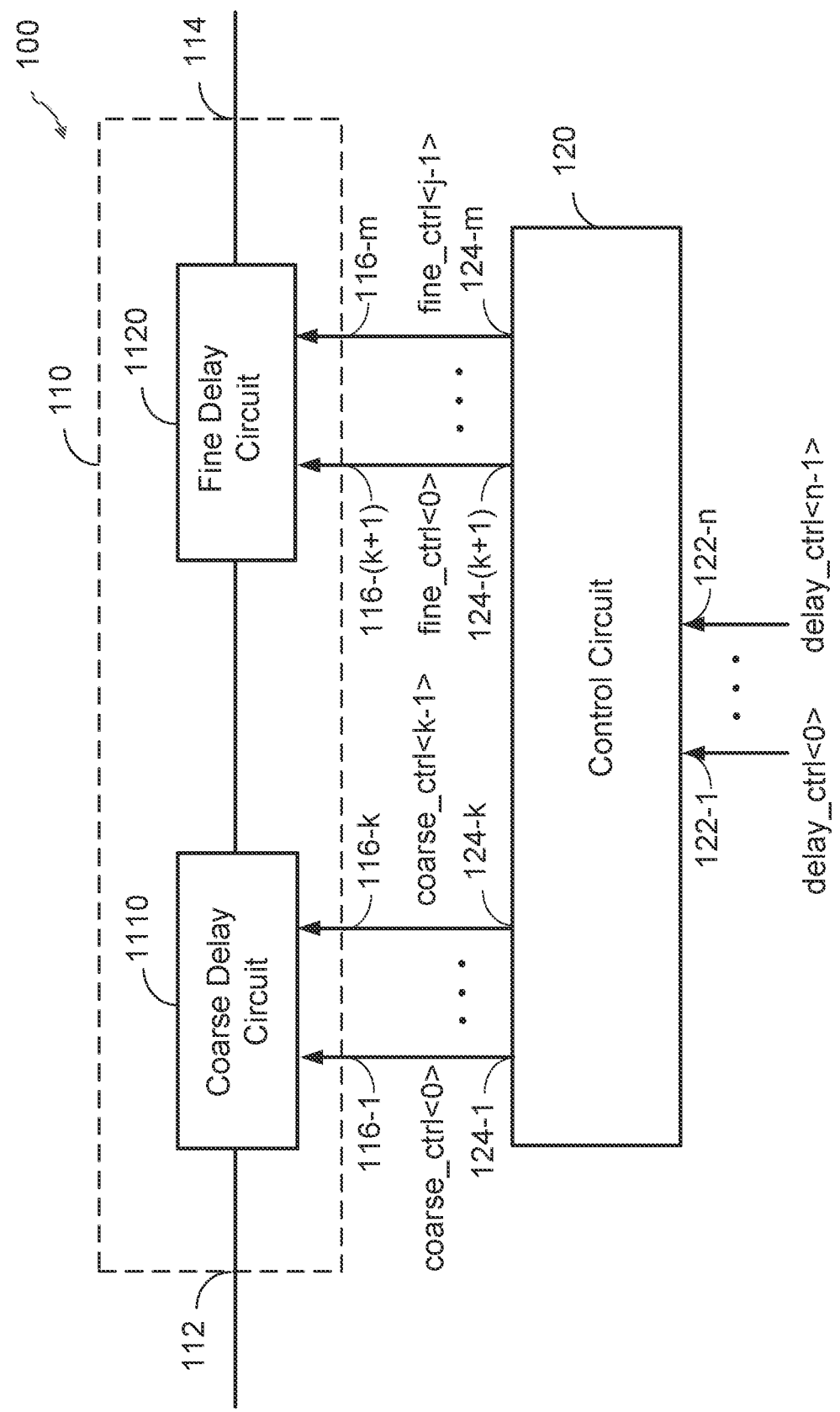
FIG. 11 shows an example in which the delay circuit includes a coarse delay circuit and a fine delay circuit according to certain aspects of the present disclosure.

FIG. 11 shows an exemplary implementation of the delay circuit 110 in which the delay circuit 110 includes a coarse delay circuit 1110 to provide the delay circuit 110 with coarse delay adjustments and a fine delay circuit 1120 to provide the delay circuit 110 with fine delay adjustments. In this example, the coarse delay circuit 1110 and the fine delay circuit 1120 are coupled in series between the input 112 and the output 114 of the delay circuit 110. Thus, in this example, the delay of the delay circuit 110 is approximately equal to the sum of the delay of the coarse delay circuit 1110 and the delay of the fine delay circuit 1120.

In this example, the m control bits of the m delay control signals include coarse control bits coarse_ctrl<k−1:0> for programming the delay of the coarse delay circuit 1110 and fine control bits fine_ctrl<j−1:0> for programming the delay of the fine delay circuit 1120, where m=k+j. The coarse control bits coarse_ctrl<k−1:0> program the delay of the coarse delay circuit 1110 in coarse delay steps and the fine control bits fine_ctrl<j−1:0> program the delay of the fine delay circuit 1120 in fine delay steps, in which one fine delay step is smaller than one coarse delay step. For example, one coarse delay step may be equal to an integer multiple of one fine delay step.

Coarse delay circuits and fine delay circuits are known in the art. A coarse delay circuit may be implemented, for example, with a network of logic gates (e.g., NAND gates) in which the coarse control bits coarse_ctrl<k−1:0> are input to respective ones of the logic gates to control the delay path of a signal in the coarse delay circuit. A fine delay circuit may be implemented, for example, with delay buffers coupled in series in which the fine control bits fine_ctrl<j−1:0> control the drive strengths of the delay buffers. Thus, the coarse delay circuit 1110 may be implemented with any suitable coarse delay circuit, and the fine delay circuit 1120 may be implemented with any suitable fine delay circuit providing finer delay adjustments than the coarse delay circuit.

In the example in FIG. 11, the control circuit 120 outputs the coarse control bits coarse_ctrl<k−1:0> via the outputs 124-1 to 124-k and outputs the fine control bits fine_ctrl<j−1:0> via the outputs 124-(k+1) to 124-m. Also, the delay circuit 110 receives the coarse control bits coarse_ctrl<k−1:0> via the control inputs 116-1 to 116-k and receives the fine control bits fine_ctrl<j−1:0> via the control inputs 116-(k+1) to 116-m.

Figure 12:
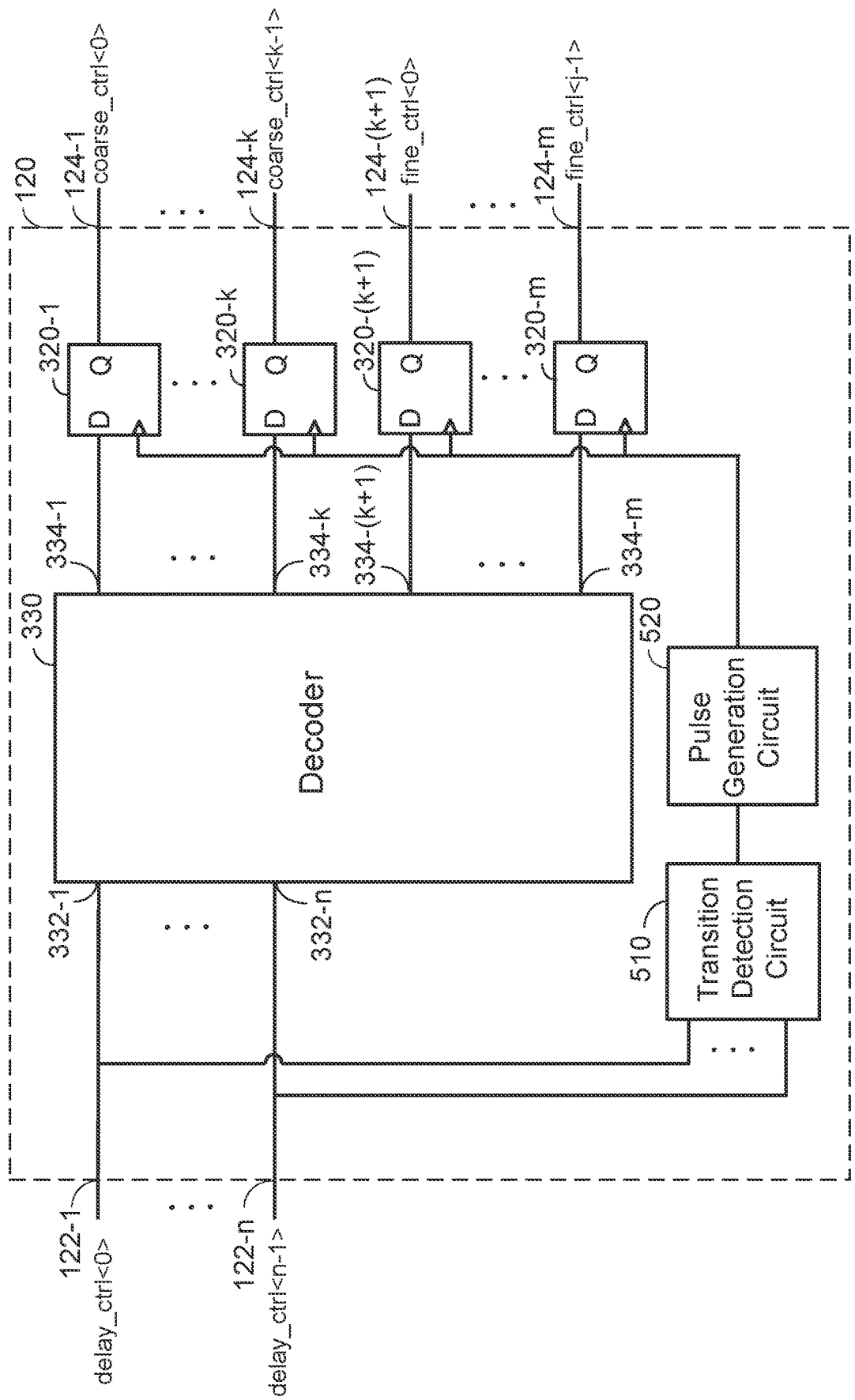
FIG. 12 shows an exemplary implementation of the control circuit including flip-flops for coarse control bits and flip-flops for fine control bits according to certain aspects of the present disclosure.

FIG. 12 shows an exemplary implementation of the control circuit 120 in which the flip-flops 320-1 to 320-m include first flip-flops 320-1 to 320-k for outputting the coarse control bits coarse_ctrl<k−1:0> and second flip-flops 320-(k+1) to 320-m for outputting the fine control bits fine_ctrl<j−1:0> where m=k+j. In this example, the signal inputs D of the first flip-flops 320-1 to 320-k are coupled to the outputs 334-1 to 334-k, respectively, of the decoder 330, and the outputs Q of the first flip-flops 320-1 to 320-k are coupled to the outputs 124-1 to 124-k of the control circuit 120. Also, in this example, the signal inputs D of the second flip-flops 320-(k+1) to 320-m are coupled to the outputs 334-(k+1) to 334-m, respectively, of the decoder 330, and the outputs Q of the second flip-flops 320-(k+1) to 320-m are coupled to the outputs 124-(k+1) to 124-m of the control circuit 120. The clock inputs of the flip-flops 320-1 to 320-m are coupled to the pulse generation circuit 520, as discussed above.

In this example, the decoder 330 is configured to convert the digital control code delay_ctrl<n−1:0> into the coarse control bits coarse_ctrl<k−1:0> and the fine control bits fine_ctrl<j−1:0>, output the coarse control bits coarse_ctrl<k−1:0> to the first flip-flops 320-1 to 320-k via the outputs 334-1 to 334-k, and output the fine control bits fine_ctrl<j−1:0> to the second flip-flops 320-(k+1) to 320-m via the outputs 334-(k+1) to 334-m.

For the example where the digital control code delay_ctrl<n−1:0> is a binary digital code, the decoder 330 may partition the n bits of the digital control code delay_ctrl<n−1:0> into a first set of bits and a second set of bits in which the first set of bits are lower order than the second set of bits. In this example, the decoder 330 may convert the first set of bits into a first thermometer code providing the fine control bits fine_ctrl<j−1:0>, and convert the second set of bits into a second thermometer code providing the coarse control bits coarse_ctrl<k−1:0>.

For instance, in one example, the digital control code delay_ctrl<n−1:0> may include 8 bits (i.e., n=8), in which the first set of bits include the three least significant bits (LSBs) of the digital control code delay_ctrl<n−1:0> and the second set of bits includes the remaining five higher-order bits of the digital control code delay_ctrl<n−1:0>. In this example, the first thermometer code providing the fine control bits fine_ctrl<j−1:0> may include eight bits (i.e., $2^3$=8), and the second thermometer code providing the coarse control bits coarse_ctrl<k−1:0> may include 32 bits (i.e., $2^5$=32). However, it is to be appreciated that the present disclosure is not limited to this example. In general, the first set of bits may include the L LSBs of the digital control code delay_ctrl<n−1:0> where L is an integer less than n, and the second set of bits may include the remaining higher-order bits of the digital control code delay_ctrl<n−1:0>. In this example, the decoder 330 may include a first binary-to-thermometer decoder for converting the L LSBs of the digital control code delay_ctrl<n−1:0> into the first thermometer code and a second binary-to-thermometer decoder for converting the remaining higher-order bits of the digital control code delay_ctrl<n−1:0> into the second thermometer code.

Figure 13:
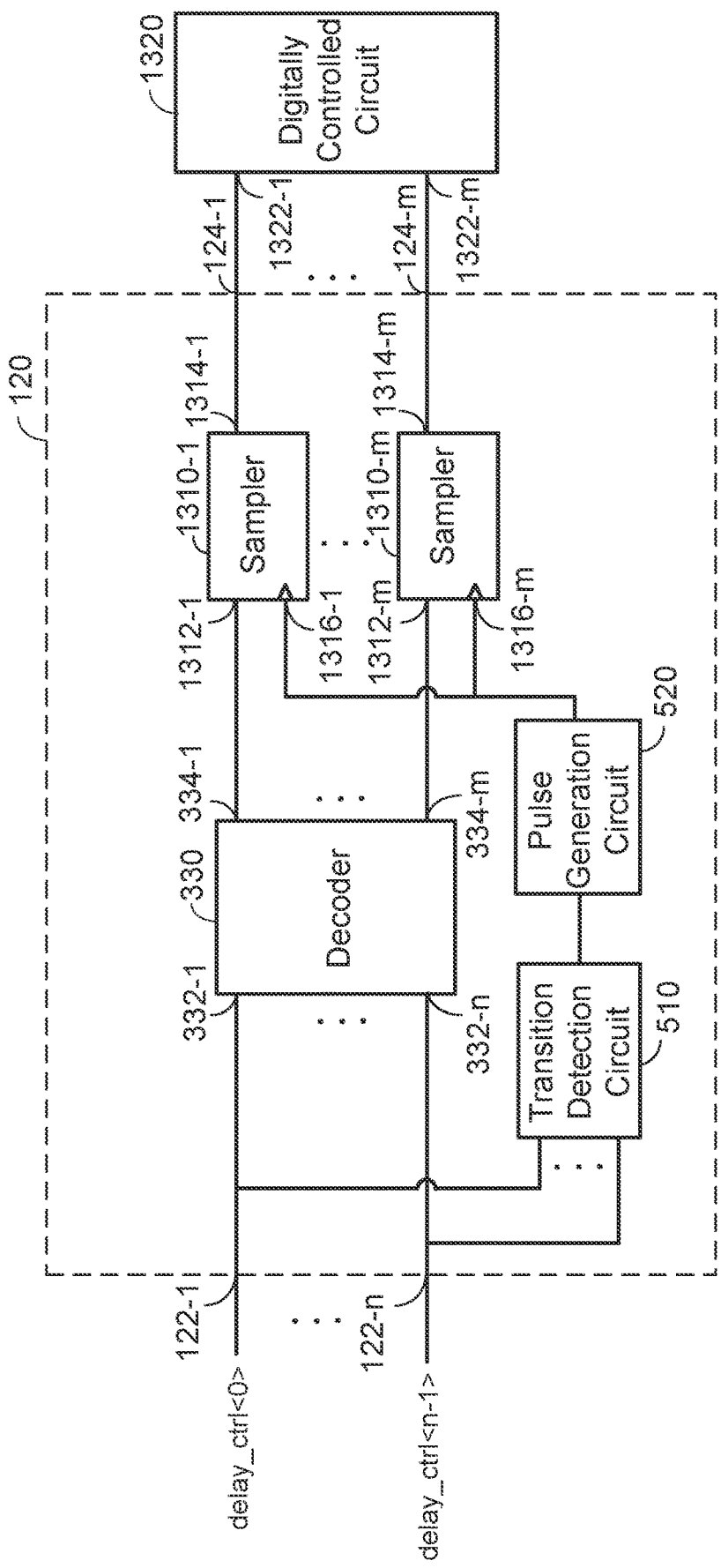
FIG. 13 shows an example of the control circuit including samplers according to certain aspects of the present disclosure.

In the examples discussed above, the flip-flops 320-1 to 320-m are used to synchronize the control signals with the synchronization pulse from the pulse generation circuit 520. However, it is to be appreciated that the control circuit 120 is not limited to the flip-flops 320-1 to 320-m. More broadly, the control circuit 120 may include samplers 1310-1 to 1310-m for synchronizing the control signals with the synchronization pulse from the pulse generation circuit 520, as shown in FIG. 13. A sampler as used herein refers to a circuit that can be configured to sample or capture data, such as a flip-flop, a latch, etc. In this example, each of the samplers 1310-1 to 1310-m has a respective signal input 1312-1 to 1312-m coupled to a respective one of the outputs 334-1 to 334-m of the decoder 330, a respective output 1314-1 to 1314-m coupled to a respective one of the outputs 124-1 to 124-m of the control circuit 120, and a respective clock input 1316-1 to 1316-m coupled to the output of the pulse generation circuit 520.

In this example, each of the samplers 1310-1 to 1310-m is configured to receive the synchronization pulse from the pulse generation circuit 520 at the respective clock input 1316-1 to 1316-m. Each of the samplers 1310-1 to 1310-m is also configured to sample (i.e., capture) the bit value of the respective control signal at the respective signal input 1312-1 to 1312-m on an edge of the synchronization pulse, and output the sampled bit value at the respective output 1314-1 to 1314-m. Each of the samplers 1310-1 to 1310-m may hold the respective sampled bit value at the respective output 1314-1 to 1314-m until the next synchronization pulse from the pulse generation circuit 520. The edge of the synchronization pulse used for sampling may be a rising edge or a falling edge. Each of the samplers 1310-1 to 1310-m may be implemented with a flip-flop (e.g., the respective one of the flip-flops 320-1 to 320-m) or any other suitable circuit configured to perform the above functions. For the example where each of the samplers 1310-1 to 1310-m is implemented with a respective one the flip-flops 320-1 to 320-m, the respective signal input 1312-1 to 1312-m corresponds to the respective signal input D of the respective one of the flip-flops 320-1 to 320-m, the respective output 1314-1 to 1314-m corresponds to the respective output Q of the respective one of the flip-flops 320-1 to 320-m, and the respective clock input 1316-1 to 1316-m corresponds to the clock input of the respective one of the flip-flops 320-1 to 320-m.

In the examples discussed above, the control circuit 120 outputs the synchronized control signals to the delay circuit 110 to program the delay of the delay circuit 110. However, it is to be appreciated that the present disclosure is not limited to this example. More broadly, the control circuit 120 may output the synchronized control signals to a digitally controlled circuit 1320, as shown in FIG. 13. In this example, the digitally controlled circuit 1320 has control inputs 1322-1 to 1322-m, in which each of the control inputs 1322-1 to 1322-m is coupled to a respective one of the outputs 124-1 to 124-m of the control circuit 120 to receive a respective one of the synchronized control signals. In this example, the synchronized control signals program (i.e., control) a parameter of the digitally controlled circuit 1320. For example, the digitally controlled circuit 1320 may be a delay circuit (e.g., the delay circuit 110) in which the control signals program the delay of the delay circuit. In another example, the digitally controlled circuit 1320 may be an oscillator in which the control signals program the output frequency the oscillator. In another example, the digitally controlled circuit 1320 may be a frequency divider in which the control signals program the divider of the frequency divider.

Figure 14:
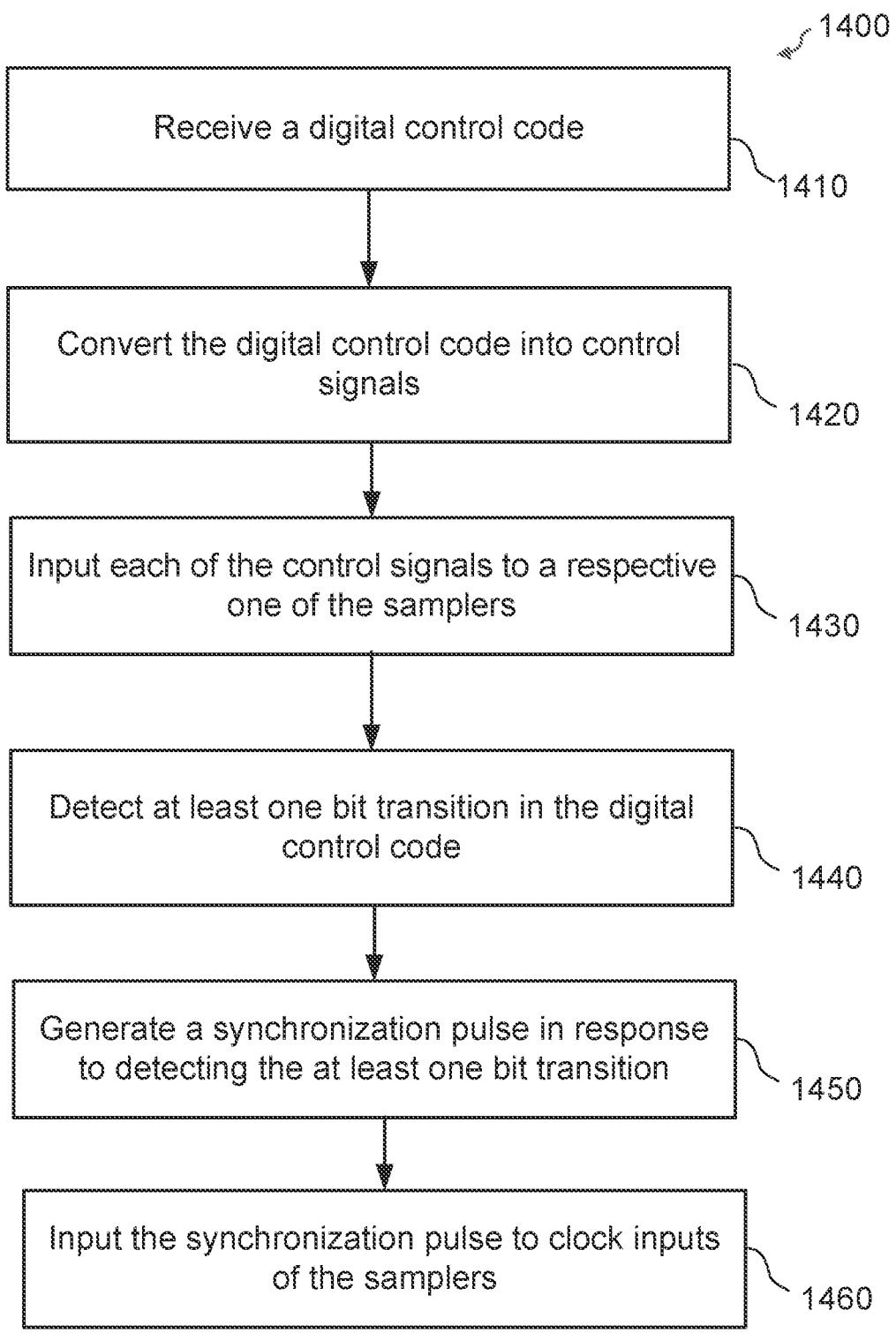
FIG. 14 is a flowchart illustrating a method of synchronization using samplers according to certain aspects of the present disclosure.

FIG. 14 shows an exemplary method 1400 of synchronization using samplers according to certain aspects. The samplers may correspond to the samplers 1310-1 to 1310-m. In certain aspects, each of the samplers 1310-1 to 1310-m may be implemented with a respective one of the flip-flops 320-1 to 320-m.

At block 1410, a digital control code is received. For example, the digital control code may correspond to the digital control code delay_ctrl<n−1:0>.

At block 1420, the digital control code is converted into control signals. For example, the decoder 330 may convert the digital control code into the control signals. The control signals may correspond to the m control signals output from the decoder 330 and may include the m control bits discussed above. In certain aspects, the digital control code includes a binary digital code, and converting the digital control code into the control signals includes converting the binary digital code into one or more thermometer codes.

At block 1430, each of the control signals is input to a respective one of the samplers 1310-1 to 1310-m. For example, each of the control signals may be input to the signal input 1312-1 to 1312-m of a respective one of the samplers 1310-1 to 1310-m. For the example where each of the samplers 1310-1 to 1310-m is implemented with a respective one of the flip-flops 320-1 to 320-m, each of the control signals may be input to the input D of the respective one of the flip-flops 320-1 to 320-m.

At block 1440, at least one bit transition is detected in the digital control code. For example, the transition detection circuit 510 may detect the at least one bit transition in the digital control code delay_ctrl<n−1:0>.

At block 1450, a synchronization pulse is generated in response to detecting the at least one bit transition in the digital control code. For example, the pulse generation circuit 520 may generate the synchronization pulse.

At block 1460, the synchronization pulse is input to clock inputs of the samplers. For example, the clock inputs may correspond to the clock inputs 1316-1 to 1316-m of the samplers 1310-1 to 1310-m. For the example where each of the samplers 1310-1 to 1310-m is implemented with a respective one of the flip-flops 320-1 to 320-*m*, the clock inputs may correspond to the clock inputs of the flip-flops 320-1 to 320-*m*.

In certain aspects, the method 1400 may further include outputting the control signals from the samplers to a delay circuit, wherein the delay circuit is configured to set a delay of the delay circuit based on the control signals. For example, the delay circuit may correspond to the delay circuit 110.

In certain aspects, detecting the at least one bit transition in the digital control code includes detecting multiple bit transitions in the digital control code, and generating a respective detection pulse for each one of the multiple bit transitions. For example, the transition detectors 710-1 to **710-*n* may generate the respective detection pulses. In certain aspects, generating the synchronization pulse includes combining the respective detection pulses. For example, the combiner 720** may combine the respective detection pulses.

In certain aspects, the method 1400 further includes delaying the synchronization pulse by a delay using a pulse delay circuit to meet a setup time. For example, the pulse delay circuit 730 may delay the synchronization pulse. In this example, the samplers may be implemented with the flip-flops 320-1 to **320-*m*, and the setup time may correspond to a set up time of the flip-flops 320-1 to 320-*m***.

Implementation examples are described in the following numbered clauses:

1. A system, comprising:
    a decoder having inputs and outputs, wherein the decoder is configured to receive
    a digital control code at the inputs of the decoder, generate control signals based on the digital control code, and output each of the control signals at a respective one of the outputs of the decoder;
    samplers, wherein each of the samplers has a respective signal input coupled to a respective one of the outputs of the decoder, a respective clock input, and a respective output;
    a transition detection circuit configured to detect at least one bit transition in the digital control code; and
    a pulse generation circuit coupled to the transition detection circuit and the respective clock inputs of the samplers, wherein the pulse generation circuit is configured to output a synchronization pulse to the respective clock inputs of the samplers when the transition detection circuit detects the at least one bit transition in the digital control code.

2. The system of clause 1, further comprising a delay circuit having control inputs, wherein the respective output of each of the samplers is coupled to a respective one of the control inputs of the delay circuit, and the delay circuit is configured to set a delay of the delay circuit based on the control signals.

3. The system of clause 1 or 2, wherein the transition detection circuit comprises transition detectors, and wherein each of the transition detectors has a respective detector input coupled to a respective one of the inputs of the decoder, and a respective detector output coupled to the pulse generation circuit.

4. The system of clause 3, wherein each of the transition detectors is configured to:
    detect a bit transition at the respective detector input; and
    output a respective detection pulse at the respective detector output when the bit transition at the respective detector input is detected.

5. The system of clause 4, wherein the pulse generation circuit comprises a combiner configured to receive the respective detection pulses of the transition detectors, and combine the respective detection pulses to generate the synchronization pulse.

6. The system of clause 5, wherein the combiner comprises an OR gate having inputs and an output, and each of the inputs of the OR gate is coupled to the respective detector output of a respective one of the transition detectors.

7. The system of clause 5 or 6, wherein the pulse generation circuit further comprises a pulse delay circuit coupled between the combiner and the respective clock inputs of the samplers.

8. The system of clause 7, wherein each of the samplers comprises a respective flip-flop, and the pulse delay circuit is configured to delay the synchronization pulse by a delay that meets a setup time of the flip-flops.

9. The system of clause 7 or 8, wherein the pulse generation circuit further comprises a clock driver coupled between the pulse delay circuit and the respective clock inputs of the samplers.

10. The system of any one of clauses 3 to 9, wherein each of the transition detectors comprises:
    a respective exclusive-OR gate having a respective first input coupled to the respective detector input, a respective second input, and a respective output coupled to the respective detector output; and
    a respective delay circuit coupled between the respective detector input and the respective second input of the respective exclusive-OR gate.

11. The system of clause 10, wherein the pulse generation circuit comprises an OR having inputs and an output, and each of the inputs of the OR gate is coupled to the respective detector output of a respective one of the transition detectors.

12. The system of clause 11, wherein the pulse generation circuit further comprises a pulse delay circuit coupled between the output of the OR gate and the respective clock inputs of the samplers.

13. The system of clause 12, wherein each of the samplers comprises a respective flip-flop, and the pulse delay circuit is configured to delay the synchronization pulse by a delay that meets a setup time of the flip-flops.

14. The system of clause 12 or 13, wherein the pulse generation circuit further comprises a clock driver coupled between the pulse delay circuit and the respective clock inputs of the samplers.

15. The system of any one of clauses 1 to 14, wherein the digital control code comprises a binary digital code.

16. The system of clause 15, wherein the decoder is configured to convert the binary digital code into one or more thermometer codes, and the control signals include the one or more thermometer codes.

17. The system of any one of clauses 1 to 16, wherein each of the samplers comprises a respective flip-flop.

18. A method of synchronization using samplers, comprising:
    receiving a digital control code;
    converting the digital control code into control signals;
    inputting each of the control signals to a respective one of the samplers;
    detecting at least one bit transition in the digital control code;
    generating a synchronization pulse in response to detecting the at least one bit transition in the digital control code; and inputting the synchronization pulse to clock inputs of the samplers.

19. The method of clause 18, wherein the digital control code comprises a binary digital code, and wherein converting the digital control code into the control signals comprises converting the binary digital code into one or more thermometer codes.

20. The method of clause 18 or 19, further comprising outputting the control signals from the samplers to a delay circuit, wherein the delay circuit is configured to set a delay of the delay circuit based on the control signals.

21. The method of any one of clauses 18 to 20, wherein detecting the at least one bit transition in the digital control code comprises:
   detecting multiple bit transitions in the digital control code; and
   generating a respective detection pulse for each one of the multiple bit transitions.

22. The method of clause 21, wherein generating the synchronization pulse comprises combining the respective detection pulses.

23. The method of any one of clauses 18 to 23, wherein the samplers comprise flip-flops.

24. The method of clause 23, further comprising delaying the synchronization pulse by a delay that meets a setup time of the flip-flops.

25. A system, comprising:
   a decoder configured to receive a digital control code and convert the digital control code into control signals;
   a transition detection circuit configured to detect at least one bit transition in the digital control code;
   a pulse generation circuit configured to output a synchronization pulse when the transition detection circuit detects the at least one bit transition in the digital control code; and
   samplers, wherein each of the samplers is configured to receive a respective one of the control signals, capture a bit value of the respective one of the control signals based on the synchronization pulse, and output the captured bit value of the respective one of the control signals.

26. The system of clause 25, wherein each of the samplers is configured to capture the bit value of the respective one of the control signals on a rising edge of the synchronization pulse.

27. The system of clause 25, wherein each of the samplers is configured to capture the bit value of the respective one of the control signals on a falling edge of the synchronization pulse.

28. The system of any one of clauses 25 to 27, further comprising a delay circuit having control inputs, wherein each of the samplers is configured to output the captured bit value of the respective one of the control signals to a respective one of the control inputs of the delay circuit, and the delay circuit is configured to set a delay of the delay circuit based on the control signals.

29. The system of any one of clauses 25 to 28, wherein the at least one bit transition in the digital control code includes multiple bits transitions in the digital control code, the transition detection circuit is configured to output a respective detection pulse for each of the multiple bit transitions in the digital control code, and the pulse generation circuit is configured to combine the respective detection pulses to generate the synchronization pulse.

30. The system of any one of clauses 25 to 29, wherein each of the samplers comprises a respective flip-flop.

31. The system of clause 30, wherein the pulse generation circuit is configured to delay the synchronization pulse by a delay that meets a setup time of the flip-flops.

32. The system of any one of clauses 25 to 31, wherein the digital control code includes a binary digital code, the decoder is configured to convert the binary digital code into one or more thermometer codes, and the control signals include the one or more thermometer codes.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   a decoder having inputs and outputs, wherein the decoder is configured to receive a digital control code at the inputs of the decoder, generate control signals based on the digital control code, and output each of the control signals at a respective one of the outputs of the decoder;
   samplers, wherein each of the samplers has a respective signal input coupled to a respective one of the outputs of the decoder, a respective clock input, and a respective output;
   a transition detection circuit configured to detect at least one bit transition in the digital control code; and
   a pulse generation circuit coupled to the transition detection circuit and the respective clock inputs of the samplers, wherein the pulse generation circuit is configured to output a synchronization pulse to the respective clock inputs of the samplers when the transition detection circuit detects the at least one bit transition in the digital control code.

2. The system of claim 1, further comprising a delay circuit having control inputs, wherein the respective output of each of the samplers is coupled to a respective one of the control inputs of the delay circuit, and the delay circuit is configured to set a delay of the delay circuit based on the control signals.

3. The system of claim 1, wherein the transition detection circuit comprises transition detectors, and wherein each of the transition detectors has a respective detector input coupled to a respective one of the inputs of the decoder, and a respective detector output coupled to the pulse generation circuit.

4. The system of claim 3, wherein each of the transition detectors is configured to:
  detect a bit transition at the respective detector input; and
  output a respective detection pulse at the respective detector output when the bit transition at the respective detector input is detected.

5. The system of claim 4, wherein the pulse generation circuit comprises a combiner configured to receive the respective detection pulses of the transition detectors, and combine the respective detection pulses to generate the synchronization pulse.

6. The system of claim 5, wherein the combiner comprises an OR gate having inputs and an output, and each of the inputs of the OR gate is coupled to the respective detector output of a respective one of the transition detectors.

7. The system of claim 5, wherein the pulse generation circuit further comprises a pulse delay circuit coupled between the combiner and the respective clock inputs of the samplers.

8. The system of claim 7, wherein each of the samplers comprises a respective flip-flop, and the pulse delay circuit is configured to delay the synchronization pulse by a delay that meets a setup time of the flip-flops.

9. The system of claim 7, wherein the pulse generation circuit further comprises a clock driver coupled between the pulse delay circuit and the respective clock inputs of the samplers.

10. The system of claim 3, wherein each of the transition detectors comprises:
  a respective exclusive-OR gate having a respective first input coupled to the respective detector input, a respective second input, and a respective output coupled to the respective detector output; and
  a respective delay circuit coupled between the respective detector input and the respective second input of the respective exclusive-OR gate.

11. The system of claim 10, wherein the pulse generation circuit comprises an OR having inputs and an output, and each of the inputs of the OR gate is coupled to the respective detector output of a respective one of the transition detectors.

12. The system of claim 11, wherein the pulse generation circuit further comprises a pulse delay circuit coupled between the output of the OR gate and the respective clock inputs of the samplers.

13. The system of claim 12, wherein each of the samplers comprises a respective flip-flop, and the pulse delay circuit is configured to delay the synchronization pulse by a delay that meets a setup time of the flip-flops.

14. The system of claim 12, wherein the pulse generation circuit further comprises a clock driver coupled between the pulse delay circuit and the respective clock inputs of the samplers.

15. The system of claim 1, wherein the digital control code comprises a binary digital code.

16. The system of claim 15, wherein the decoder is configured to convert the binary digital code into one or more thermometer codes, and the control signals include the one or more thermometer codes.

17. The system of claim 1, wherein each of the samplers comprises a respective flip-flop.

18. A method of synchronization using samplers, comprising:
  receiving a digital control code;
  converting the digital control code into control signals;
  inputting each of the control signals to a respective one of the samplers;
  detecting at least one bit transition in the digital control code;
  generating a synchronization pulse in response to detecting the at least one bit transition in the digital control code; and
  inputting the synchronization pulse to clock inputs of the samplers.

19. The method of claim 18, wherein the digital control code comprises a binary digital code, and wherein converting the digital control code into the control signals comprises converting the binary digital code into one or more thermometer codes.

20. The method of claim 18, further comprising outputting the control signals from the samplers to a delay circuit, wherein the delay circuit is configured to set a delay of the delay circuit based on the control signals.

21. The method of claim 18, wherein detecting the at least one bit transition in the digital control code comprises:
  detecting multiple bit transitions in the digital control code; and
  generating a respective detection pulse for each one of the multiple bit transitions.

22. The method of claim 21, wherein generating the synchronization pulse comprises combining the respective detection pulses.

23. The method of claim 18, wherein the samplers comprise flip-flops.

24. The method of claim 23, further comprising delaying the synchronization pulse by a delay that meets a setup time of the flip-flops.

25. A system, comprising:
  a decoder configured to receive a digital control code and convert the digital control code into control signals;
  a transition detection circuit configured to detect at least one bit transition in the digital control code;
  a pulse generation circuit configured to output a synchronization pulse when the transition detection circuit detects the at least one bit transition in the digital control code; and
  samplers, wherein each of the samplers is configured to receive a respective one of the control signals, capture a bit value of the respective one of the control signals based on the synchronization pulse, and output the captured bit value of the respective one of the control signals.

* * * * *